(12) United States Patent
Shah et al.

(10) Patent No.: US 8,318,512 B2
(45) Date of Patent: Nov. 27, 2012

(54) AUTOMATED SUBSTRATE HANDLING AND FILM QUALITY INSPECTION IN SOLAR CELL PROCESSING

(75) Inventors: Vinay K. Shah, San Francisco, CA (US); Suresh Kumaraswami, San Jose, CA (US); Damon K. Cox, Round Rock, TX (US)

(73) Assignee: Applied Materials, Inc., Santa Clara, CA (US)

( * ) Notice: Subject to any disclaimer, the term of this patent is extended or adjusted under 35 U.S.C. 154(b) by 429 days.

(21) Appl. No.: 12/769,517

(22) Filed: Apr. 28, 2010

(65) Prior Publication Data

US 2010/0279439 A1 Nov. 4, 2010

Related U.S. Application Data

(60) Provisional application No. 61/173,899, filed on Apr. 29, 2009.

(51) Int. Cl.
*H01L 21/66* (2006.01)
*H04N 7/18* (2006.01)

(52) U.S. Cl. .......... 438/15; 438/14; 414/222.01; 901/30

(58) Field of Classification Search ............ 438/15; 414/222.01; 901/30
See application file for complete search history.

(56) References Cited

U.S. PATENT DOCUMENTS

| | | | |
|---|---|---|---|
| 6,137,303 A | 10/2000 | Deckert et al. | |
| 6,177,129 B1 | 1/2001 | Wagner et al. | |
| 6,235,634 B1 | 5/2001 | White et al. | |
| 6,539,106 B1 | 3/2003 | Gallarda et al. | |
| 6,923,077 B2 | 8/2005 | Kim et al. | |
| 7,233,841 B2 | 6/2007 | Sadighi et al. | |
| 7,654,221 B2 | 2/2010 | Lubomirsky et al. | |
| 2007/0071581 A1 | 3/2007 | Gilchrist et al. | |
| 2009/0001616 A1 | 1/2009 | Bonora et al. | |
| 2009/0196487 A1 | 8/2009 | Yishai et al. | |
| 2010/0087028 A1 | 4/2010 | Porthouse et al. | |
| 2012/0130295 A1* | 5/2012 | Haider | 602/18 |

FOREIGN PATENT DOCUMENTS

KR 20-0143983 6/1999

OTHER PUBLICATIONS

International Search Report and Written Opinion dated Dec. 17, 2010 for International Application No. PCT/US2010/033034.

* cited by examiner

*Primary Examiner* — Angel Roman
(74) *Attorney, Agent, or Firm* — Patterson & Sheridan, LLP (57) ABSTRACT

The present invention generally provides an apparatus and a method for automatically calibrating the placement of fragile substrates into a substrate carrier. Embodiments of the present invention also provide an apparatus and a method for inspecting the fragile substrates prior to processing to prevent damaged substrates from being further processed or broken in subsequent transferring steps. Embodiments of the invention also generally provide an apparatus and a method for determining the alignment and orientation substrates that are to be delivered into or removed from a substrate carrier. Embodiments of the invention further provide an apparatus and method for accurately positioning the substrate carrier for substrate loading. The substrate carriers are generally used to support a batch of substrates that are to be processed in a batch processing chamber.

20 Claims, 6 Drawing Sheets

AUTOMATED SUBSTRATE HANDLING AND FILM QUALITY INSPECTION IN SOLAR CELL PROCESSING

CROSS-REFERENCE TO RELATED APPLICATIONS

This application claims benefit of U.S. Provisional Patent Application Ser. No. 61/173,899, filed Apr. 29, 2009, which is herein incorporated by reference.

BACKGROUND OF THE INVENTION

1. Field of the Invention

Embodiments of the invention generally relate to an apparatus and method for forming a solar cell device. The invention is particularly useful for fabrication of crystalline silicon solar cells.

2. Description of the Related Art

Photovoltaics (PV) or solar cells are devices which convert sunlight into direct current (DC) electrical power. A typical PV cell includes a p-type silicon wafer, substrate, or sheet typically less than about 0.3 mm thick with a thin layer of an n-type silicon material disposed on top of the p-type substrate. The generated voltage, or photo-voltage, and generated current by the photovoltaic device are dependent on the material properties of the p-n junction, the interfacial properties between deposited layers, and the surface area of the device. When exposed to sunlight, the p-n junction of the PV cell generates pairs of free electrons and holes. The electric field formed across the depletion region of p-n junction separates the free electrons and holes, creating a voltage. A circuit from n-side to p-side allows the flow of electrons when the PV cell is connected to an electrical load. Electrical power is the product of the voltage times the current generated as the electrons and holes move through an external load and eventually recombine. Solar cells generate a specific amount of power and cells are tiled into modules sized to deliver the desired amount of system power. Solar modules are created by connecting a number of solar cells and are then joined into panels with specific frames and connectors.

The photovoltaic (PV) market has experienced growth with annual growth rates exceeding above 30% for the last ten years. Some articles have suggested that solar cell power production world wide may exceed 10 GWp in the near future. It has been estimated that more than 90% of all photovoltaic modules are silicon wafer based. The high market growth rate in combination with the need to substantially reduce solar electricity costs has resulted in a number of serious challenges for silicon wafer production development for photovoltaics.

In general, silicon substrate based solar energy technology follows two main strategies to reduce the costs of solar electricity by use of PV solar cells. One approach is increasing the conversion efficiency of single junction devices (i.e., power output per unit area) and the other is lowering costs associated with manufacturing the solar cells. Since the effective cost reduction due to conversion efficiency is limited by fundamental thermodynamic and physical limits, the amount of possible gain depends on basic technological advances, such as aspects of the invention disclosed herein. The other strategy to make commercially viable solar cells lies in reducing the manufacturing costs required to form the solar cells.

In order to meet these challenges, the following solar cell processing requirements generally need to be met: 1) the cost of ownership (CoO) for substrate fabrication equipment needs to be improved (e.g., reduce wafer breakage, high system throughput, high machine up-time, inexpensive machines, inexpensive consumable costs), 2) the area processed per process cycle needs to be increased (e.g., reduce processing per Wp) and 3) the quality of the formed layers and film stack formation processes needs to be well controlled and be sufficient to produce highly efficient solar cells. Therefore, there is a need to cost effectively process silicon substrates for solar cell applications.

Further, as the demand for solar cell devices continues to grow, there is a trend to reduce cost by increasing the substrate throughput and improving the quality of the deposition processes performed on the substrate. However, the cost associated with producing and supporting all of the processing components in a solar cell production line and the chamber parts continue to escalate dramatically. To reduce costs associated with manufacturing solar cells, it is desirable to design solar cell automation components and a solar cell processing sequence to increase the manufacturing line throughput, improved device yield, reduce the chamber down time due processing damaged substrates, and reduce the number of broken substrates caused by handling the fragile solar cell substrates.

SUMMARY OF THE INVENTION

In one embodiment of the present invention, a solar cell formation process comprises positioning a substrate carrier having an array of substrate receiving positions on a carrier receiving surface, positioning a substrate on a substrate receiving surface of an end effector of a robot and determining an actual position of the substrate on the substrate receiving surface of the end effector. The determining the actual position comprises emitting electromagnetic radiation towards a surface of the substrate and the substrate receiving surface of the end effector and receiving a portion of the emitted electromagnetic radiation at a defined wavelength reflected from the surface of the substrate and the substrate receiving surface of the end effector by a detector, wherein the detector uses the received portion of the emitted electromagnetic radiation to form a first image. The process further provides positioning the substrate in one of the array of substrate receiving positions, wherein positioning the substrate comprises adjusting the placement of the substrate using the information received from the first image.

In another embodiment, a solar cell formation process comprises positioning an end effector of a robot in a nominal position over a first substrate disposed in one of an array of substrate receiving positions on a substrate carrier, receiving the first substrate on the end effector while the end effector is in the nominal position, determining an actual position of the first substrate positioned on the end effector using a detection system, calculating an offset of the actual position from an expected position of the first substrate on the end effector, calculating a new nominal position using the offset and storing the new nominal position in memory of a system controller, receiving a second substrate on the end effector, positioning the end effector in the new nominal position, and depositing the second substrate in the one of the array of substrate receiving positions.

In yet another embodiment of the present invention, a solar cell processing system comprises a robot having an end effector configured to receive a substrate, a detection system, and a system controller. The detection system comprises an electromagnetic radiation source configured to emit electromagnetic radiation at one or more desired wavelengths, a detection assembly that is positioned to receive at least a portion of the emitted electromagnetic radiation reflected from a surface of a substrate disposed on the end effector of the robot, and one or more walls that are adapted to at least partially enclose the electromagnetic radiation source and the detection assembly. The processing system further comprises a system controller configured to receive a signal from the detection assembly regarding the position of the substrate that is disposed on the end effector of the robot and determine an actual position of the substrate with respect to the end effector.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numerals have been used, where applicable, to designate identical elements that are common between figures. It is contemplated that features of one embodiment may be incorporated in other embodiments without further recitation.

DETAILED DESCRIPTION

Figure 1:
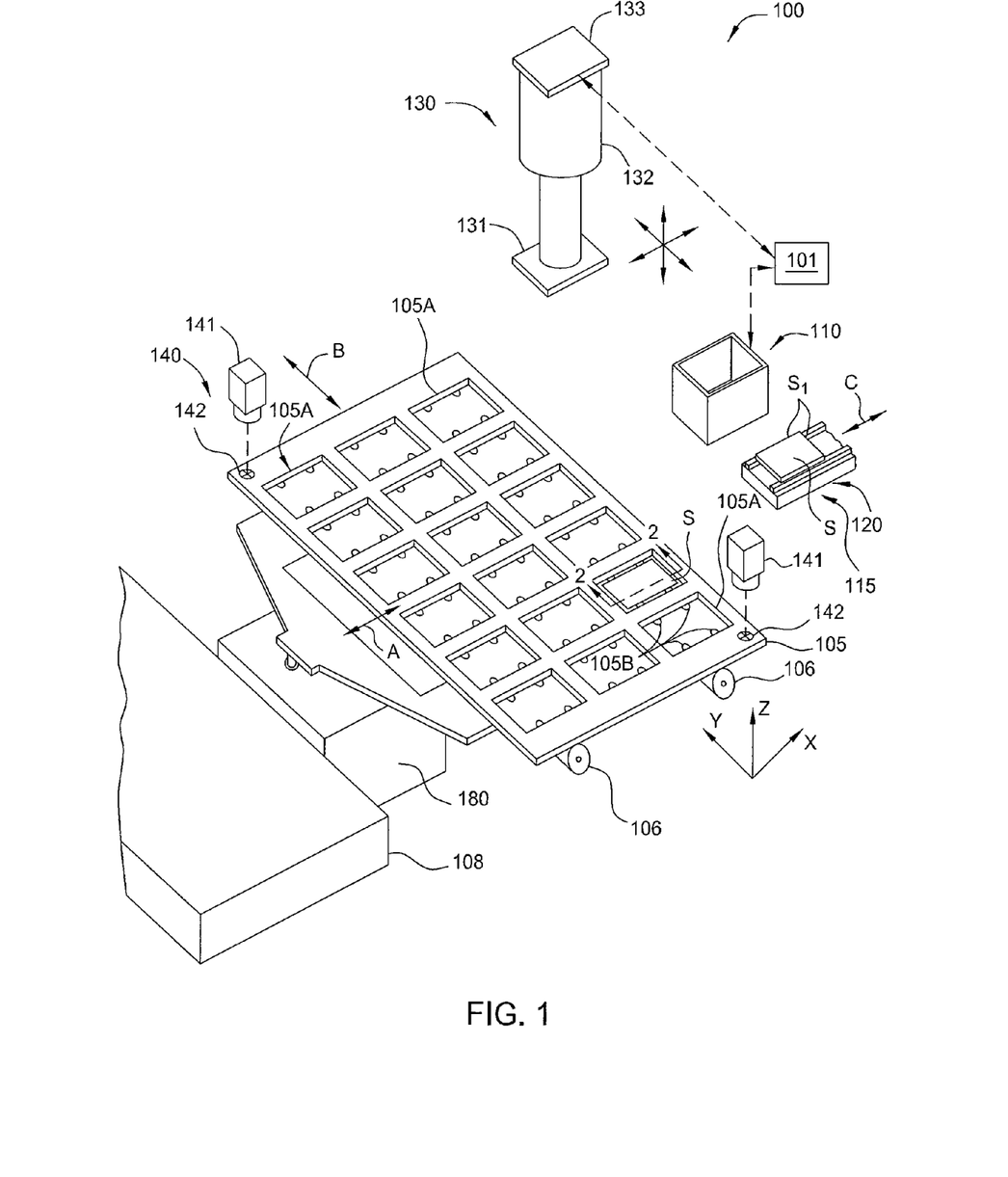
FIG. 1 is an isometric view of a loading station that may be used according to one embodiment described herein.

The present invention generally provides an apparatus and a method for automatically calibrating the placement of fragile substrates into a substrate carrier. Embodiments of the present invention also provide an apparatus and a method for inspecting the fragile substrates prior to processing to prevent damaged substrates from being further processed or broken in subsequent transferring steps. Embodiments of the invention also generally provide an apparatus and a method for determining the alignment and orientation of substrates that are to be delivered into or removed from the substrate carrier. Embodiments of the invention further provide an apparatus and method for accurately positioning the substrate carrier for substrate loading. The substrate carrier is used to support a batch of substrates that are to be processed in a batch processing module. In one example, as shown in FIG. 1, a loading station 100, which is positioned adjacent to a processing module 108 (FIG. 1), is configured to load and/or remove substrates "S" from the multiple substrate receiving positions 105A formed in a substrate carrier 105. The processing module 108 may include one or more load lock chambers and one or more processing chambers that may be used in conjunction with the apparatus and methods described herein. The processing chambers may include, but are not limited to, processing chambers that are adapted to perform one or more of the processes used to form a crystalline solar cell. For example, the processing chambers may include wet chemical processing chambers, screen printing chambers, physical vapor deposition (PVD) chambers, plasma enhanced chemical vapor deposition (PECVD) chambers, hot wire chemical vapor deposition (HWCVD) chambers, ion implant/doping chambers, plasma nitridation chambers, atomic layer deposition (ALD) chambers, plasma or vapor chemical etching chambers, laser anneal chambers, rapid thermal oxidation (RTO) chamber, rapid thermal nitridation (RTN) chamber, rapid thermal annealing (RTA) chamber, a vapor etching chamber, a forming gas or hydrogen annealer, a plasma cleaning chamber, and/or other similar processing chambers.

FIG. 1 is a schematic, isometric view of one embodiment of loading station 100 that has a robot assembly 130, a detection system 110 and system controller 101 that are used to deliver substrates "S" between a transfer location 115 and the substrate receiving positions 105A formed in the substrate carrier 105. The transfer location 115 may be coupled to a conveyor system 120 which is used to deliver substrates to and from other areas of a solar cell factory. The conveyor system 120 may be able to receive and dispatch substrates "S" from a substrate cassette, substrate stack box, or conventional conveyor system along a transfer path "C". In one embodiment, the substrate carrier 105 has between about 10 and 100 substrate receiving positions 105A that are used to support and retain the substrates "S" during processing in the processing module 108.

Figure 2:
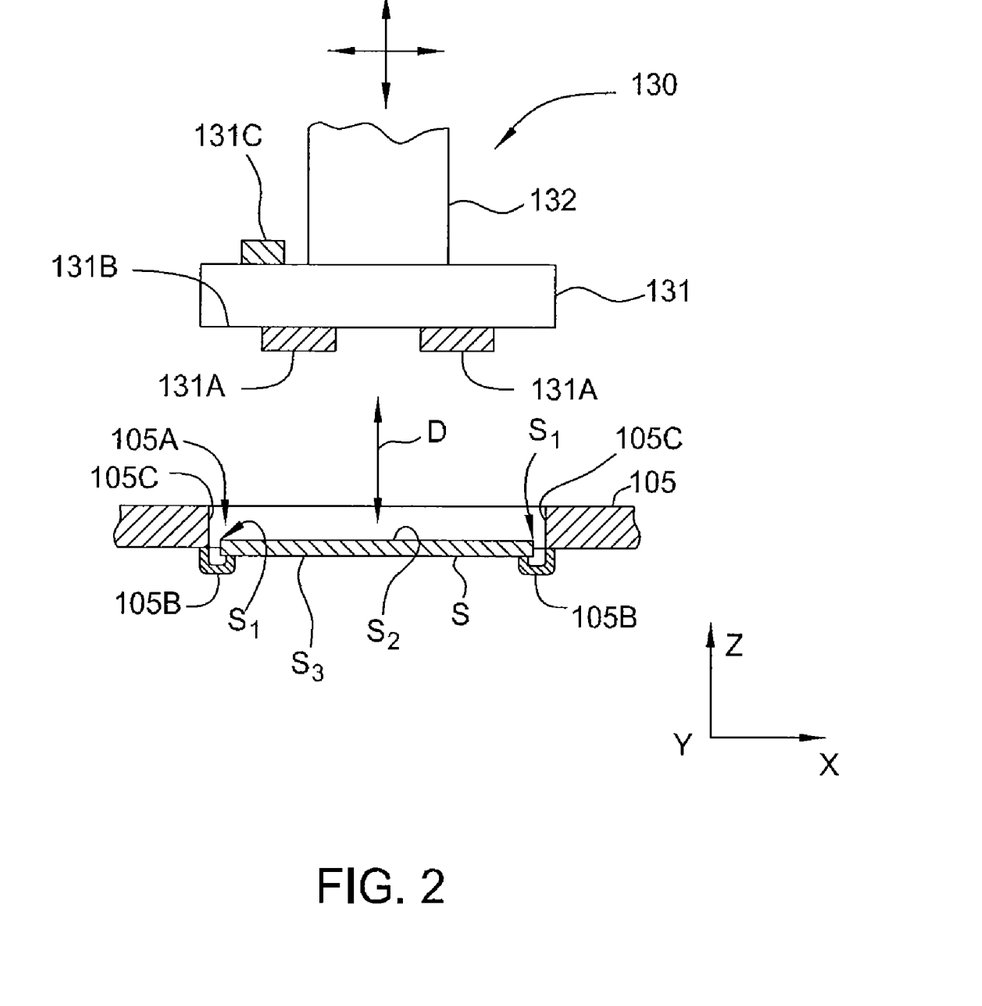
FIG. 2 is a close-up side cross-sectional view of one of region of a substrate carrier sectioned along the cross-sectioning line 2-2, which is illustrated in FIG. 1, according to one embodiment described herein.

FIG. 2 is a close-up side cross-sectional view of one of the substrate receiving positions 105A formed by sectioning the substrate carrier 105 along the cross-sectioning line 2-2 (FIG. 1). In general, the substrates "S" are disposed on substrate supports 105B that are connected to or formed on the substrate carrier 105. The substrate supports 105B are generally configured to support a substrates "S" during processing and interface with the robot assembly 130 during transferring processes.

The robot assembly 130 generally comprises an end effector assembly 131 and robot 132 that are coupled to a base 133, which is attached to a supporting structure (not shown) found in the loading station 100. The supporting structure (not shown) is generally used to retain and support the various components contained within the loading station 100. In one configuration, as shown in FIG. 1, the robot 132 is supported in an inverted position so that the substrate receiving components 131A (FIG. 2) contained in the end effector assembly 131 can contact the upper surface $S_2$ of a substrate "S" positioned in the substrate receiving position 105A from the top. The robot 132 may be a SCARA, six-axis, parallel, or linear type robot that can be adapted to transfer substrates from one position within the loading station 100 to another. In one example, the robot 132 is a Quattro Parallel Robot that is available from Adept Technology, Inc. of Pleasanton, Calif. It should be noted that the configuration of the robot assembly 130 and loading station 100, as shown in FIG. 1, is not intended to be limiting as to the scope of the invention described herein.

Figure 3:
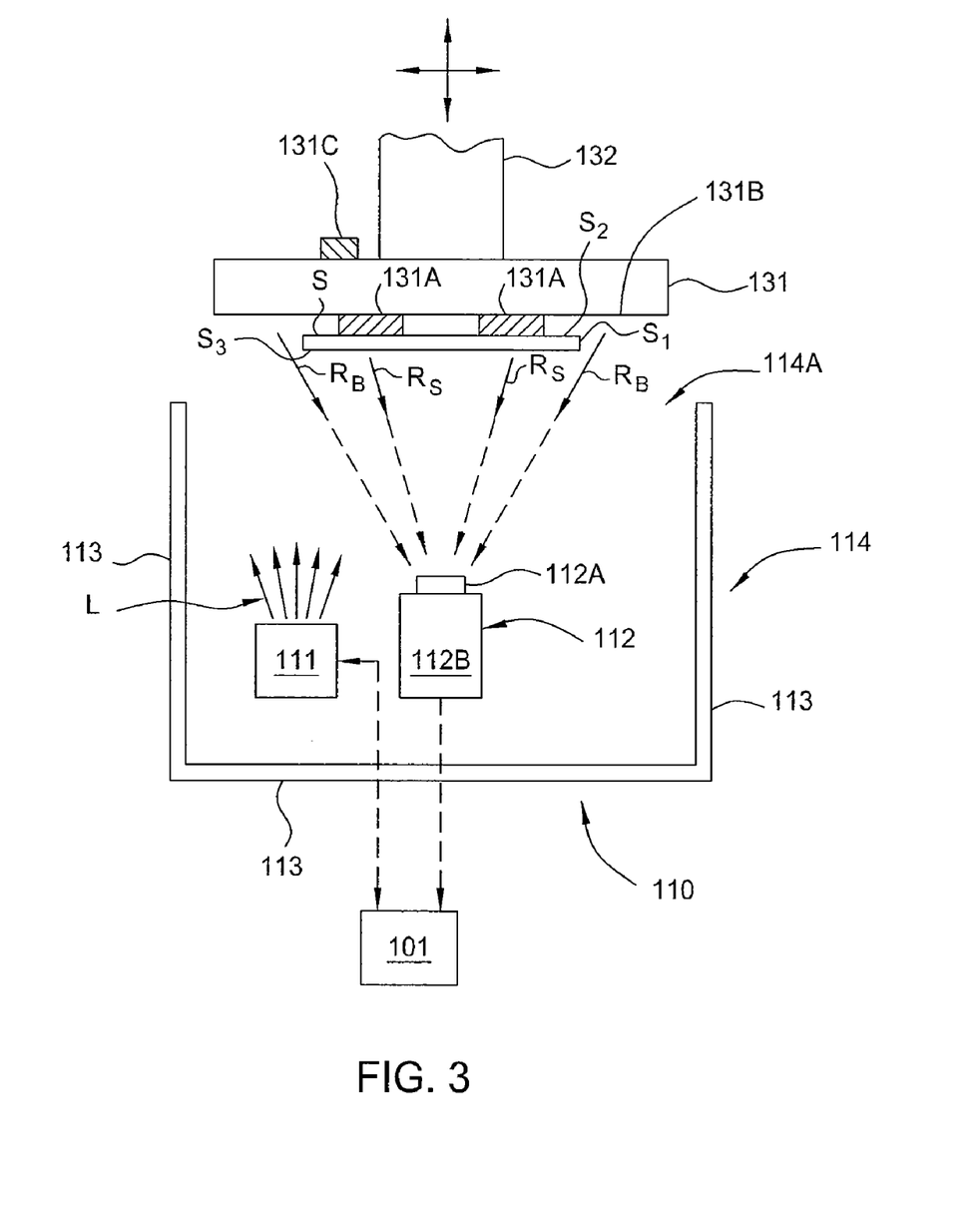
FIG. 3 is a cross-sectional view of a detection assembly and end effector according to one embodiment described herein.

Referring to FIGS. 1 and 3, in one embodiment, the loading station 100 comprises a detection system 110 that is used to determine the actual position of a substrate "S" disposed on the substrate receiving components 131A (FIG. 2) in the robot assembly 130 by use of a radiation source 111 and detection assembly 112 that are coupled to the system controller 101. In general, the substrate "S" can be grasped or retained on the substrate receiving components 131A by use of a conventional Bernoulli chuck, vacuum chuck, or other similar substrate retaining components. The detection system 110 is configured to inspect and determine the relative position of a substrate "S" disposed on the end effector assembly 131 that is disposed over the detection system 110. In general, the position of the substrate "S" on the end effector assembly 131 is determined by noting the position of the end effector assembly 131 and determining difference in position and angular orientation of the substrate "S" from a desired position on the substrate receiving components 131A by use of an image sent to the system controller 101 from the detection assembly 112.

The radiation source 111 is generally configured to emit electromagnetic radiation at one or more wavelengths towards a surface of the substrate. The radiation emitted by the radiation source 111 is then generally reflected by a substrate "S" and/or a surface 131B of the end effector assembly 131, which is then received by the detection assembly 112. The radiation source 111 may be a light-emitting diode (LED), laser, conventional lamp, broad band light source, or other similar electromagnetic radiation source. In one embodiment, the radiation source 111 comprises a light-emitting diode (LED) that is adapted to emit wavelengths of light in the visible band towards the substrate. In another embodiment, the radiation source 111 comprises a broadband lamp and one or more filters to allow only selective wavelengths of radiation to be delivered to a surface of the substrate "S". In another embodiment, the radiation source 111 comprises a broadband lamp and one or more filters 112A that allow only selective wavelengths of radiation to be delivered to the detection assembly 112.

The detection assembly 112 generally includes an electromagnetic radiation detector, camera or other similar device that is configured to measure the intensity of the received electromagnetic radiation at one or more wavelengths. In one embodiment, the radiation source 111 and detection assembly 112 are positioned so that a portion of the emitted radiation "L" leaving the radiation source 111 is reflected towards the detection assembly 112. For example, a portion of the emitted radiation "L" is reflected from the surface $S_3$ of the substrate "S" (i.e., reflected radiation $R_s$) and a portion of the emitted radiation "L" is reflected from the surface 131B of the end effector assembly 131 (i.e., reflected radiation $R_B$). In one embodiment, the detection assembly 112 includes a camera 112B that is configured to detect and resolve features of a substrate "S", such as the edges $S_1$, within a desired wavelength range emitted by the radiation source 111. In one embodiment, the camera 112B comprises a CCD camera that is adapted to determine variations in reflected intensity across the surface of the substrate in the form a gray-scale image. It is believed that use of a gray-scale type CCD camera has advantages, since it can reduce the image processing time required by the system controller 101 versus color images, and also reduce the cost and complexity of the detection assembly 112. The reduction in image processing time is especially advantageous for use in solar cell manufacturing, since the typical desired substrate throughput through some solar cell processing tools is about 6000 substrates per hour, or an average throughput of one substrate every 0.06 seconds.

In some configurations, it is desirable to isolate the detection assembly 112 from ambient light by enclosing or shielding the areas surrounding the substrate "S" and the camera 112B. In one embodiment, the detection system 110 generally comprises a radiation source 111, a detection assembly 112 and an enclosure 114. The enclosure 114 generally contains a plurality of walls 113 that are adapted to minimize the amount of unwanted stray light from being received by the detection assembly 112. In one embodiment, during the analysis process steps (e.g., step 408 in FIG. 4) the end effector assembly 131 is configured to substantially cover an opening 114A formed in the enclosure 114 so that the emitted radiation "L" that is received by the camera 112B primarily consists of the reflected radiation $R_s$ and/or the reflected radiation $R_B$.

In general, the system controller 101 is used to control one or more components and processes performed in the loading station 100. The system controller 101 is generally designed to facilitate the control and automation of the loading station 100 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, process timing and support hardware (e.g., sensors, robots, motors, timing devices, etc.), and monitor the processes (e.g., chemical concentrations, processing variables, chamber process time, I/O signals, etc.) performed in the processing modules 108. The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program, or computer instructions, readable by the system controller 101 determines which tasks are performable on a substrate. Preferably, the program is software readable by the system controller 101 that includes code to perform tasks relating to monitoring, execution and control of the movement, support, and/or positioning of a substrate along with the various process recipe tasks and various chamber process recipe steps being performed in the loading station 100. In one embodiment, the system controller 101 is used to control the process variables in the processing modules 108 and a robotic device(s) to control the strategic movement, scheduling and running of the loading station 100 to make the processes repeatable, resolve queue time issues and prevent over or under processing of the substrates.

Figure 4:
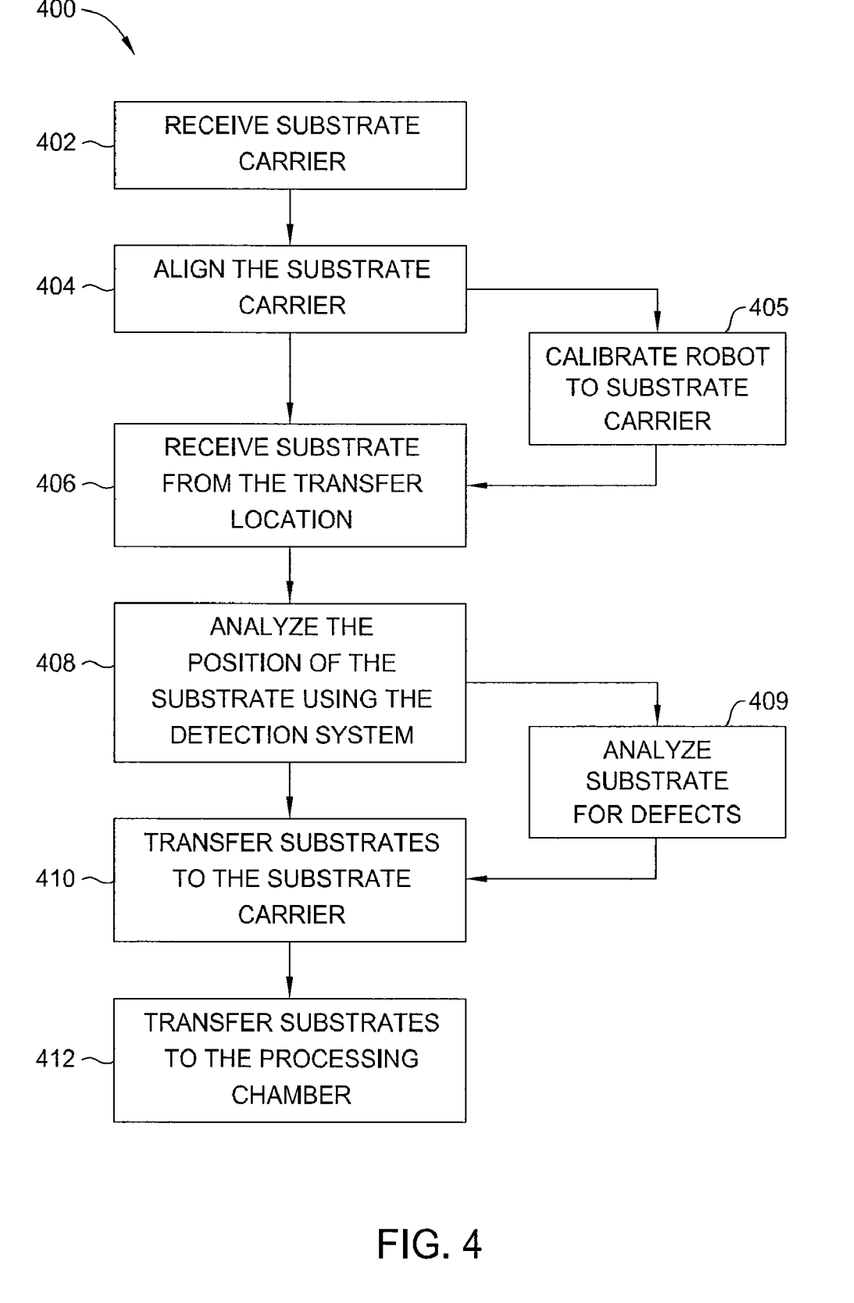
FIG. 4 is a process flow diagram used to load a substrate carrier with substrates according to one embodiment described herein.

FIG. 4 illustrates a process sequence 400 used to serially transfer a plurality of substrates from a transfer location 115 to a substrate carrier 105. The process sequence 400 generally starts with step 402, in which an empty substrate carrier 105 is received by the loading station 100. The empty substrate carrier 105 is generally transferred into a desired position within the loading station 100 by use of one or more automation components 106. In one example, an empty substrate carrier 105 is received from an adjacent substrate carrier retaining device (not shown) following path "B" (FIG. 1) via a carrier robot 180, and is placed on the automation components 106, such as a roller conveyor system. Prior to loading the substrates "S" into the substrate carrier 105, the exact substrate carrier 105 position is first determined, as discussed below, so that the robot 132 can reliably place the to a substrate carrier 105 in their desired substrate receiving positions 105A.

Next, at step 404, the substrate carrier 105 is aligned to a desired position within the loading station 100. In one embodiment, the exact position of the substrate carrier 105 is determined using a machine vision system 140 (FIG. 1) and one or more reference features or fiducial marks 142 (FIG. 1) formed on the substrate carrier 105. In one embodiment, the reference features may be one or more edges and corners of the substrate carrier 105. By use of one or more detectors 141 that are positioned to view the fiducial marks 142 found on the substrate carrier 105, the position and angular orientation of the substrate carrier 105 can be determined by the system controller 101. In one embodiment, the detectors 141 are CCD cameras, or other similar devices, which are adapted to send images to the system controller 101 for analysis. The position and angular orientation of the substrate carrier 105 is determined by noting the offset in position of the fiducial marks 142 from a known reference frame or nominal position stored within the system controller 101. Therefore, since the system controller 101 in most cases also has the position of each of the substrate receiving positions 105A relative to the detectors 141 stored in memory, the combination of the robot assembly 130, detection system 110 and system controller 101 can be used to reliably orient and position the substrates "S" in each of the substrate receiving positions 105A using the information gained from analyzing the position and orientation of the fiducial marks 142 relative to the reference frame. Alternatively, in one embodiment, the exact position of the substrate carrier 105 is determined by physically adjusting the position of the substrate carrier 105 using manual reference location features, such as datum surfaces, and/or automated devices that are adapted to automatically adjust and control the position the substrate carrier (e.g., automated centering devices, automated robotic elements). In another embodiment, the substrate carrier 105 is positioned as subsequently described with respect to FIG. 6 in the "Auto-Calibration for Substrate Carrier Positioning" section.

In one embodiment, if the system controller 101 does not know the position of each of the substrate receiving positions 105A relative to the detectors 141, if the robot 132 has lost its calibrated position, and/or if the loading station 100 has received a substrate carrier 105 of an unknown type or quality, a robot calibration step, or step 405, is performed. In one example, the robot is manually taught each of the substrate receiving positions 105A using alignment fixtures and manual alignment steps performed by a technician. Since the manual process of aligning the robot 132 to the substrate receiving positions 105A (e.g., 10-100 positions) can create a significant amount of down time, there is a need for an automated calibration process that can reliably calibrate the robot 132 to each of the substrate receiving positions 105A. A process of automatically calibrating the robot 132 to the substrate receiving positions 105A is further described below in the "Auto-Calibration and Substrate Transferring Processes" section.

In one embodiment, the fiducial marks 142 are also configured to provide information that may be important to the subsequent processing of the substrates "S" disposed in the substrate receiving positions 105A of the substrate carrier 105 to the system controller 101. In one configuration, the fiducial marks 142 that are disposed on a surface of the substrate carrier 105 are formed to so that they provide various types of information to the system controller 101 when viewed by the one or more detectors 141. In one embodiment, the fiducial marks 142 are formed so that they provide an alignment function and an information providing function. The alignment function is generally a feature that is formed on a surface of the substrate carrier 105, which, as discussed above, is used by the system controller 101 to define the actual position and orientation of the substrate carrier 105 in space. The formed features may be lines, crosses, alphanumeric elements or other geometric shapes that when viewed by the one or more detectors 141 provide the substrate carrier's position and/or orientation information to the system controller 101.

Alternately, the information providing element may be a mark, bar code, geometric shape, or alphanumeric symbol that when viewed by the one or more detectors 141 provides information to the system controller 101 about the carrier 105 and/or substrates "S" disposed therein. In one configuration, the fiducial mark 142 comprises a bar code that when viewed by the one or more detectors 141, and analyzed by the components in the system controller 101, provides information about the type of substrate carrier 105 being used and/or the substrates "S" being processed. In one example, the information providing element contains such information as the number of receiving positions 105A in the substrate carrier 105, the type of material from which the substrate carrier 105 is made, the geometric shape of the substrate carrier 105, the size of the substrate receiving positions 105A, the depth of the substrate receiving positions 105A, the distinct substrate carrier serial number, the substrate type to be used (e.g., 125 mm×125 mm substrates, 156 mm×156 mm substrates, substrate thickness (200 um-300 um)) and any other useful substrate carrier property. In some cases, the distinct substrate carrier serial number may be used by the system controller 101 to keep track of the number of times each substrate carrier 105 has been used, and to keep track and associate each substrate "S" with a specific substrate carrier 105 so that the system controller 101 can make decisions about where the substrate carrier 105 and/or substrates "S" need to go next in the processing sequence. In one example, the system controller 101 may use the serial number information to decide when the substrate carrier 105 has reached its useful lifetime and needs to be discarded or cleaned before further processing. In another example, the system controller 101 may use the serial number information to store and keep track of each of the calibrated drop-off/pick-up positions of each of the substrate receiving positions 105A in the substrate carrier 105 relative to the fiducial mark 142 to allow this information to be used in subsequent loading and unloading operations, thus preventing the need for recalibration each time a substrate carrier 105 is re-used. The substrate carrier 105 information can be useful to prevent substrates "S" from being misprocessed and/or prevent the wrong substrate carrier 105 from being used in the system. It should be noted that the alignment function and the information providing function of the fiducial mark 142 may be formed in one feature formed on the surface of the substrate carrier 105 and need not be physically separate or distinct features.

Next, at step 406, the substrate receiving components 131A are brought into contact with a substrate "S" that is disposed in the transfer location 115 using the robot 132 and the system controller 101. Once the substrate receiving components 131A are in contact with the substrate surface, the substrate "S" is grasped, or chucked, by use of one of the substrate receiving components 131A, which is discussed above.

In step 408, after grasping, or chucking, the substrate "S" to the substrate receiving components 131A, the robot 132 then positions the substrate "S" over the detection system 110, as shown in FIG. 3. In one embodiment, the movement of the robot 132 is not "stopped" over the detection system 110. Rather the detection system 110 is positioned along a "smooth" path between the transfer location 115 and the substrate carrier 105 that is in position to receive the substrates "S". As the robot 132 moves along the "smooth" path, a sensor within the detection system 110 detects the end effector assembly 131, and an image is captured by the detection assembly 112. During this step the position and angular orientation of the substrate "S" is determined by use of the image received by the system controller 101 from the detection assembly 112. The difference in the substrate's position on the end effector assembly 131 relative to a centered substrate position is used to correct for any error in placement of the substrate "S" on the end effector assembly 131. In one embodiment, the substrate placement in a substrate receiving position 105A is adjusted based on the information obtained from the image received by the system controller 101 from the detection assembly 112.

In one embodiment of the process sequence 400, an optional additional processing step, or step 409, is used to analyze an image received from the detection system 110 to determine if the substrate "S" retained on the end effector assembly 131 is damaged, or if a prior deposited layer formed on the surface of the substrate "S" has a defect in it. In another embodiment, the optional additional processing step is performed during a part of step 408. An example of one or more process(es) that can be performed during step 408 or 409 to determine if the substrate is damaged is further described below in the "Film Quality And Substrate Defect Inspection System" section.

At step 410, the substrate "S" is transferred to the substrate supports 105B found in a desired substrate receiving position 105A. In this step the system controller 101 uses the information received during steps 404 and 406, and in some cases step 405, to reliably place the substrate "S" in the substrate receiving position 105A.

Finally, at step 412, once all of the substrate receiving positions 105A are filled with substrates "S", the system controller 101 advances the substrate carrier 105 into a processing module 108 so that a process can be performed on the substrates "S". The transport of the substrate carrier 105 may be provided by automation components 106 controlled by the system controller 101. Alternatively, the transport of the substrate carrier 105 may be provided by the carrier robot 180 controlled by the system controller 101. Examples of similar robots that may be adapted for use as the carrier robot 180 are disclosed in commonly owned U.S. application Ser. No. 12/247,135 filed on Oct. 7, 2008 by Kurita et al. and U.S. Pat. No. 6,847,730 issued on Jan. 25, 2005 to Beer et al., both of which are incorporated by reference in their entireties herein to the extent not inconsistent with the present disclosure.

Film Quality and Substrate Defect Inspection System

One of the main substrate processing tools in a crystalline silicon solar factory is the surface passivation tool, which is used to deposit a silicon nitride (SiN), silicon oxide ($SiO_2$), silicon oxynitride or other similar layer on a solar cell substrate. The deposited film may act as a passivation layer and/or as an anti-reflective coating. In one embodiment, passivation tools require substrates to be arranged on a substrate carrier for processing, and then unloaded from the substrate carrier after processing is complete. The system controller 101 and detection system 110 are used to guide a robot 132 through the process of loading and unloading substrates "S" from the substrate carrier 105. The detection system 110 uses a camera 112B to locate the precise position and orientation of the substrate "S". Embodiments of the invention may also use the camera 112B to inspect the substrate "S" for defects, such as chips and cracks. A need exists for an inexpensive method for gross detection of film defects that is fast enough to be done for every transferred substrate, even in the highest throughput systems. Since solar cell substrates typically have surface features or underlying elements that tend to make the differentiation of defects in or on the substrate hard to determine, there is a need for a reliable detection technique to determine if defects exist in the substrate or on the substrate surface. Typical features that tend to make the differentiation of defects difficult include large scale surface roughness (e.g., 10-100 micrometers) and the presence of optically visible large multi-crystalline grains that are commonly found in crystalline solar cell devices.

Therefore, in one embodiment, during the step(s) of determining the position and angular orientation of the substrate "S," using the detection assembly 112 and system controller 101, an image is collected to further determine if the substrate "S" retained on the end effector assembly 131 is damaged or has a defect in a prior deposited film layer formed on the surface of the substrate "S". In one embodiment of the process sequence 400, an analysis of the substrate is performed, as discussed herein in conjunction with step 409 of FIG. 4.

In one embodiment of the process sequence 400, the inspection of the substrate "S" is performed using the same image used to determine the position and angular orientation of the substrate "S." In another embodiment, a first image is collected and used by the system controller 101 to determine the position and angular orientation of the substrate "S", and a second image is collected and used by the system controller 101 to determine if the substrate "S" has a film defect or is physically damaged. The second image may contain different information from the first image due to the use of one or more different detection devices (e.g., different camera(s)), radiation sources (e.g., emits at different wavelength of light) or different positioning of the end effector assembly 131. In processing tools that coat the bottom surface $S_3$ (FIG. 3) of the substrate "S", the same image can be used for the film inspection, since the coated surface of the substrate "S" can be viewed by the detection assembly 112.

In one embodiment, the detection system 110 utilizes the optical properties of the top surface or upper most layer disposed on the surface of the substrate "S" to discern if a defect exists in the substrate "S". In one configuration, the radiation source 111 is configured to emit electromagnetic radiation at one or more wavelengths that is absorbed by regions of the surface of the substrate "S". In one embodiment, the radiation source 111 is configured to only emit electromagnetic radiation at one or more wavelengths that are absorbed by a passivation layer or an anti-reflective coating (ARC) that is disposed on a surface of the substrate "S". In one example, it is desirable for the radiation source 111 to emit radiation at a wavelength of about 630 nm, since silicon nitride is commonly used in these applications, and silicon nitride typically has a greater than 99% absorption rate at this wavelength. In this configuration, the only radiation received by the camera 112B is the radiation reflected from regions of the substrate surface that are not able to absorb the emitted radiation or radiation that is reflected from the surroundings, such as the surface 113B of the walls 113. In one embodiment, it is desirable to select or configure the surface 113B of the walls 113 so that it reflects most of the radiation emitted from the radiation source 111 (e.g., paint the surface white). Under these conditions, a well-coated substrate "S" appears black and the background appears bright in the formed image because the selected wavelength of the emitted radiation is absorbed by the coating, and the surface of the end effector tends to reflect all emitted light. However, the defectively coated regions found on the substrate surface reflect some light, which appears in a gray-scale image as gray zones.

In another embodiment, the substrates "S" that are to be loaded into the substrate carrier 105 are uncoated. In yet another embodiment, the substrates "S" that are to be loaded into the substrate carrier 105 only have the upper surface $S_2$ coated. In such embodiments, the surface 131B of the walls 113 is coated so that it absorbs most of the radiation emitted from the radiation source 111. Under these conditions, an uncoated substrate surface $S_3$ appears bright and the background appears black in the formed image because the selected wavelength of the emitted radiation is absorbed by the coated surface 131B of the end effector, and the surface $S_3$ of the substrate "S" tends to reflect all of the emitted light.

In one embodiment, to maximize the speed at which the film and defect analysis is performed, the collected image received from the detection assembly 112 is taken using a gray-scale image. In this case, the image processing algorithm used by the system controller 101 does not apply sophisticated color recognition techniques. Instead, a simple binary analysis is performed in which areas above a threshold gray-level are considered "black", and areas below the threshold level are considered "white". Therefore, a substrate "S" could be rejected if an area larger than an allowable size appears "white". It is believed that a binary type image processing algorithm is performed more rapidly than other conventional color recognition techniques, allowing every substrate to be inspected, even in the highest throughput tools (e.g., 6,000+ substrates per hour). In addition, the time to transmit the image from the camera to the image processor is also minimized due to the fact that a gray-scale image is used since the amount of data in a gray-scale image is far less than that in a full color image.

In an alternate embodiment of the detection system 110, which is used in cases where the top surface (e.g., reference numeral $S_2$ in FIG. 3) of the substrate "S" contains the deposited film layer, a separate image is acquired for the substrate "S" after it has been received at the transfer location 115 or when the substrate "S" is positioned in a substrate receiving position 105A. In this case, a separate image is required since the end effector assembly 131 oriented as shown in FIG. 1 tends to obscure the view of the top surface of the substrate "S" while the end effector assembly 131 is holding the substrate "S". Therefore, in this configuration the detection system 110 may also contain a separate camera (not shown) and separate radiation source (not shown) that are positioned to view and analyze a surface of a substrate "S" positioned in the substrate carrier 105 or in the transfer location 115.

Auto-Calibration and Substrate Transferring Processes

In cases where a substrate transferring robot needs to be taught multiple drop off substrate positions, manual substrate alignment processes can be time consuming and subject to calibration errors created by human error. Also, manual calibration processes can be extremely tedious, since the substrate carrier 105 may have 90 or more substrate receiving positions 105A, and can also be very subjective since the "correct location" is determined by the operator visually inspecting the robot location relative to the substrate receiving position 105A. Furthermore, it is often difficult or impossible for the operator to achieve a vantage point to accurately inspect the robot location at each substrate receiving position 105A, since the substrate carrier 105 may be very large (sometimes up to 2m wide), the end effector assembly 131 often blocks the substrate receiving position 105A from view from above, and the substrate supports 105B generally block access to the substrate carrier 105 from below.

Therefore, there is a need for an automated calibration process that can reliably calibrate the robot 132 to the substrate receiving positions 105A as discussed above in conjunction with step 405. As noted above, the substrate receiving positions 105A in a substrate carrier 105 may need to be calibrated when the system controller 101 does not know the position of each of the substrate receiving positions 105A relative to the detectors 141, the robot 132 has lost its calibrated position, and/or the loading station 100 has received a substrate carrier 105 of an unknown type or quality. In conventional robot calibration processes, the loading and unloading of substrates from the substrate carriers 105 is performed using human operators. As solar cell manufacturers move to thinner substrates and faster processing tools, automated substrate handlers are becoming increasingly important for reducing substrate breakage and meeting the processing system substrate throughput requirements. However, in order to achieve a lower substrate breakage rate using automated substrate handling systems, the robots used to "pick-and-place" the substrates must be accurately calibrated. Without an accurate "pick-and-place" robot calibration, the edges $S_1$ (FIG. 2) of the substrate "S" may touch the edge 105C of the substrate receiving position 105A, the substrate "S" may be dropped onto the substrate receiving position 105A from a larger than desirable height, or the robot 132 may even come in contact with and exert a load on the substrate "S" when trying to pick it up. Since solar cell substrates are very fragile (e.g., <0.3 mm thick), even minor inaccuracies in the robot calibration can lead to much higher substrate breakage rates versus other conventional substrate transfer processes (e.g., semiconductor automation hardware).

One challenge for automated substrate handling systems is to provide a reliable, repeatable, and accurate method of removing a substrate "S" from the substrate receiving position 105A, or "pick" step, and a method of placing a substrate "S" in the substrate receiving position 105A, or "drop" step.

During the initial startup of the loading station 100, the robot assembly 130 must be taught the nominal position of each substrate receiving position 105A. To load substrate "S" into the substrate carrier 105, the exact substrate carrier position is first determined. As discussed above, this can be done mechanically by physically locating the substrate carrier 105 using reference surfaces, or by using machine vision in which a substrate carrier 105 offset is computed by locating fiducial marks 142 on the carrier in a camera image and comparing to the nominal fiducial locations. An example of calibrating a carrier robot 180 for positioning the substrate carrier 105 is subsequently described with respect to FIG. 6 in the section entitled "Auto-Calibration for Substrate Carrier Positioning."

The process of transferring a substrate "S" between the transfer location 115 (FIG. 1) and substrate receiving position 105A requires the horizontal, angular and vertical positioning of the substrate "S" to be accurately calibrated to prevent the substrate "S" from inadvertently contacting the edges 105C of the substrate receiving position 105A or the end effector assembly 131 dropping or breaking the substrate "S" due to an incorrect vertical drop-off position. In a substrate transferring process the substrate "S" is placed into the substrate receiving position 105A by lowering the end effector assembly 131 and the substrate "S" to a height just above the substrate supports 105B (typically less than 1 mm) before releasing the substrate "S", thereby minimizing the impact of the substrate "S" on the substrate supports 105B and preventing the end effector assembly 131 from exerting a load into the often fragile solar cell substrate "S". Similarly, when receiving a substrate "S" from a substrate receiving position 105A, the end effector assembly 131 descends to a height just above the substrate "S" (typically less than 1 mm) to minimize the chance of applying a load to the substrate "S", and then chucking the substrate to the substrate receiving components 131A. For minimum substrate breakage, it is desirable to assure that the edges of the substrate "S" not come into contact with the edges 105C of the substrate carrier 105, since the substrate edges are extremely delicate.

Figure 5:
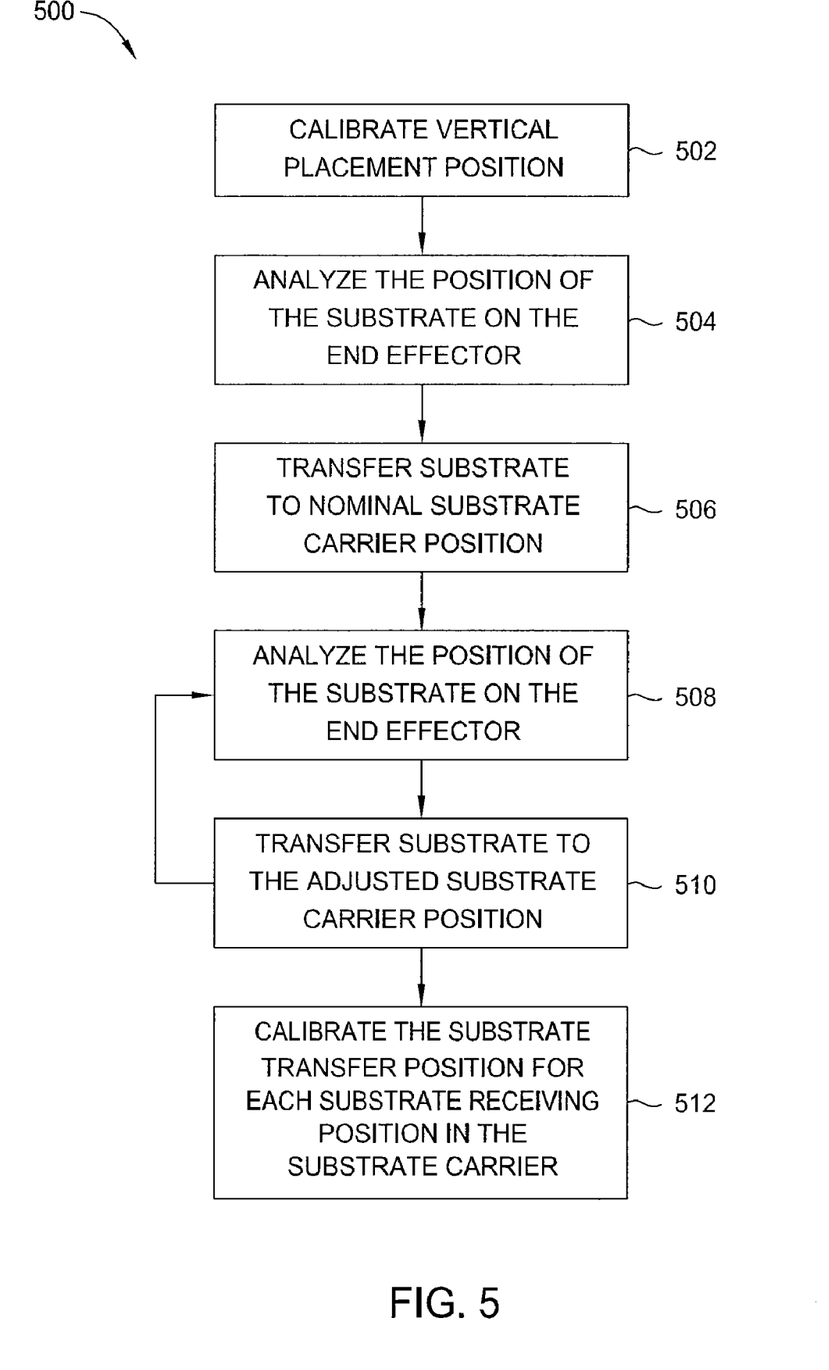
FIG. 5 is a process flow diagram illustrating a processing sequence used to automatically calibrate the placement or removal of substrates from multiple substrate supporting positions in a substrate carrier according to one embodiment described herein.

FIG. 5 illustrates one embodiment of a process sequence 500 which is performed during step 405 (FIG. 4), and used to calibrate the robot assembly 130 to the substrate receiving positions 105A formed in a substrate carrier 105 in an automated fashion. Prior to starting the process sequence 500 a substrate carrier 105 is positioned and aligned within the loading station 100, following steps 402 and 404, discussed above, to assure that the substrate carrier 105 is in a known position. In general, the system controller 101 has the nominal coordinate positions of each of the substrate receiving positions 105A relative to the fiducial marks 142 stored within its memory.

In some cases the nominal position of each of the substrate receiving positions 105A are not known. In one embodiment, the nominal substrate receiving positions 105A are automatically determined using the detection system 110 and robot assembly 130 to remove operator subjectivity, dramatically reduce the time required for teaching the positions, and eliminate the need for close physical proximity to the substrate carrier 105 to perform the calibrations. The process starts with manually loading the substrate carrier 105 with substrate "S" positioned thereon, and moving the substrate carrier 105 so that it is positioned and desirably aligned within the loading station 100 using the steps discussed in step 402. The system controller 101 then moves the end effector assembly 131 to a default substrate receiving position, and picks up the substrate "S" found at this position. The substrate "S" is then positioned over the detection system 110 so that an image of the substrate position on the end effector assembly 131 can be compared to a theoretical substrate position. The offset in the substrate distance between the actual substrate position and the theoretical position can thus be used to correct the default substrate receiving position to create a new nominal substrate position. In other words, the inverse of the substrate offset is applied to the default substrate receiving position to automatically compute a new, calibrated substrate receiving position. The process of determining the calibrated substrate receiving position can thus be completed for each substrate receiving position 105A.

In another embodiment, the nominal coordinate positions of each of the substrate receiving positions 105A relative to the fiducial marks 142 is determined by use of a separate carrier camera (not shown) that is positioned to view the substrate receiving positions 105A so that the system controller 101 can calculate the nominal positions from an image received by the separate carrier camera.

Once the substrate carrier 105 has been loaded, the process sequence 500 generally starts with step 502, in which the vertical height (i.e., z-height in FIGS. 1-2) of each substrate receiving position 105A, or drop-off position, is calibrated. In one embodiment, the substrate carrier 105 that is positioned in the loading station 100 to receive substrate "S" from the robot assembly 130 is assumed to be perfectly flat, and thus, in the simplest case, the calibrated vertical transfer height of the end effector assembly 131 can be manually calibrated using one area of the substrate carrier 105. In one example, the vertical drop-off position can simply be manually calibrated relative to one set of substrate supports 105B found in the substrate carrier 105. However, manual calibration processes can be tedious, subjective, and difficult to access given floor space limitations. In another embodiment, the vertical height is automatically calibrated relative to one set of substrate supports 105B, or other reference surface, by use of the system controller 101 and a proximity sensor 131C (FIG. 2) positioned on the end effector assembly 131. In one example, the proximity sensor 131C is a conventional optical, capacitive, or inductive type proximity sensor. In this calibration process, the end effector assembly 131 is moved from a default position safely above a substrate "S" disposed in a substrate receiving position 105A, and then lowered until the proximity sensor 131C detects the presence of the substrate "S". Due to typical variations in conventional proximity sensor response time, and possible lag time between the time the sensor is triggered and the time the robot assembly's motion controller receives the vertical height position information, it is generally important that the end effector assembly 131 be moved slowly during this calibration process. In addition, to eliminate effects of hysteresis in the proximity sensor 131C, it is also generally desirable to always sense the calibrated vertical position in the same direction (e.g., sensor state toggles between either "off" to "on", or "on" to "off"). In one embodiment, the end effector assembly 131 is moved down from the safe location above the substrate receiving position 105A at a moderate pace until the substrate proximity sensor 131C turns on. Then the end effector assembly 131 is moved up at a slow speed until the proximity sensor 131C turns off again ("on" to "off" transition). Therefore, in the case where the substrate carrier 105 is assumed to be perfectly flat, the calibrated vertical height for all the substrate receiving positions 105A is equal to the robot height at which the sensor turns off. In some cases it is desirable to also add an offset to account for variations in the proximity sensor's sensing distance.

However, typically, a substrate carrier 105 is only supported at its edges, and thus may experience significant sag in the middle of the substrate carrier 105. Therefore, the assumption that the substrate carrier 105 is perfectly flat may not be sufficient to allow for the reliable transfer of the substrates "S" to all of the substrate receiving positions 105A in the substrate carrier 105. Moreover, if the robot assembly 130 is not aligned well to the substrate carrier 105, the vertical distance between the robot assembly 130 and substrate carrier 105 may be significantly different from one edge of the substrate carrier 105 to the other. Therefore, in some cases a fixed vertical height cannot be assumed for the entire substrate carrier 105, and instead, the vertical height of each substrate receiving position 105A must be individually determined. In one embodiment, the proximity sensor 131C and system controller 101 are used to calibrate the vertical transfer position of each of the substrate receiving positions 105A by noting the end effector's vertical height at which the sensor turns off. In one example, the method involves moving the end effector assembly 131 down from the safe location at a slow speed until the proximity sensor 131C triggers ("off" to "on" transition), and then using this value plus a fixed offset as the calibrated position for that substrate receiving position 105A.

Next, at step 504, the robot 132 moves the end effector assembly 131 to the transfer location 115 (FIG. 1) to receive a substrate "S" that is positioned on the conveyor system 120. Once the substrate receiving components 131A in the end effector assembly 131 are in contact with the surface $S_2$ (FIG. 2), the substrate "S" is grasped, or chucked, by use of one of the substrate receiving components 131A, and the substrate "S" is positioned over the detection system 110, as shown in FIG. 3. During this step the position and angular orientation of the substrate "S" is determined by use of an image received by the system controller 101 from the detection assembly 112. The difference in the substrate's position on the end effector assembly 131 relative to a nominal position is thus used to help correct the placement of the substrate "S" into the substrate receiving positions 105A. Therefore, the substrate placement in a substrate receiving position 105A is adjusted based on the information obtained from the image received by the system controller 101 from the detection assembly 112.

At step 506, the substrate "S" is moved to a nominal transfer position at a substrate receiving position 105A, which is calculated by adding the information received in steps 502 and 504 to the nominal substrate receiving position 105A information stored in the system controller 101 for that particular substrate receiving position 105A. The robot assembly 130 then drops the substrate "S" into the substrate receiving position 105A by de-chucking the substrate "S" (i.e., turning off the air supplied to the Bernoulli chucks found in the substrate receiving components 131A).

Next, at step 508, the substrate "S" is then re-chucked to the substrate receiving components 131A and moved to a position over the detection system 110 so that an offset between the first alignment measurement calculated during step 504 can be compared with the substrate's new position on the end effector assembly 131. In one example, the offset distance can be calculated by comparing the different collected images of the substrate positioned on the end effector assembly 131 and/or other related information stored in the memory of the system controller 101. Therefore, a new adjusted substrate transfer position for the specific substrate receiving position 105A can be stored in the memory of the system controller 101 for use in subsequent transferring operation to that specific substrate receiving position 105A. The new adjusted position is thus the nominal substrate transfer position plus the calculated X and Y-direction offset found by the difference in the substrate positions on the end effector assembly 131.

In one embodiment, at step 510, the substrate "S" is moved to the adjusted substrate transfer position, and the substrate "S" is then dropped into the substrate receiving position 105A by de-chucking the substrate from the end effector assembly 131. In one embodiment, then step 508 is repeated again to see if the substrate "S" moved from the adjusted position found during step 508. If no significant variation in the substrate position is found between the first time step 508 was completed versus the second time the step was completed during step 510, the calibration process is complete for this substrate receiving position 105A. However, if a significant variation is found, steps 508 and 510 may be performed multiple times until the measured substrate displacement between subsequent steps is within a desirable range.

Finally, at step 512, the steps 502-510 are completed for each of the substrate receiving positions 105A found in the substrate carrier 105. By use of this method, all of the substrate receiving positions 105A can be automatically determined without significant human intervention.

Auto-Calibration for Substrate Carrier Positioning

Figure 6:
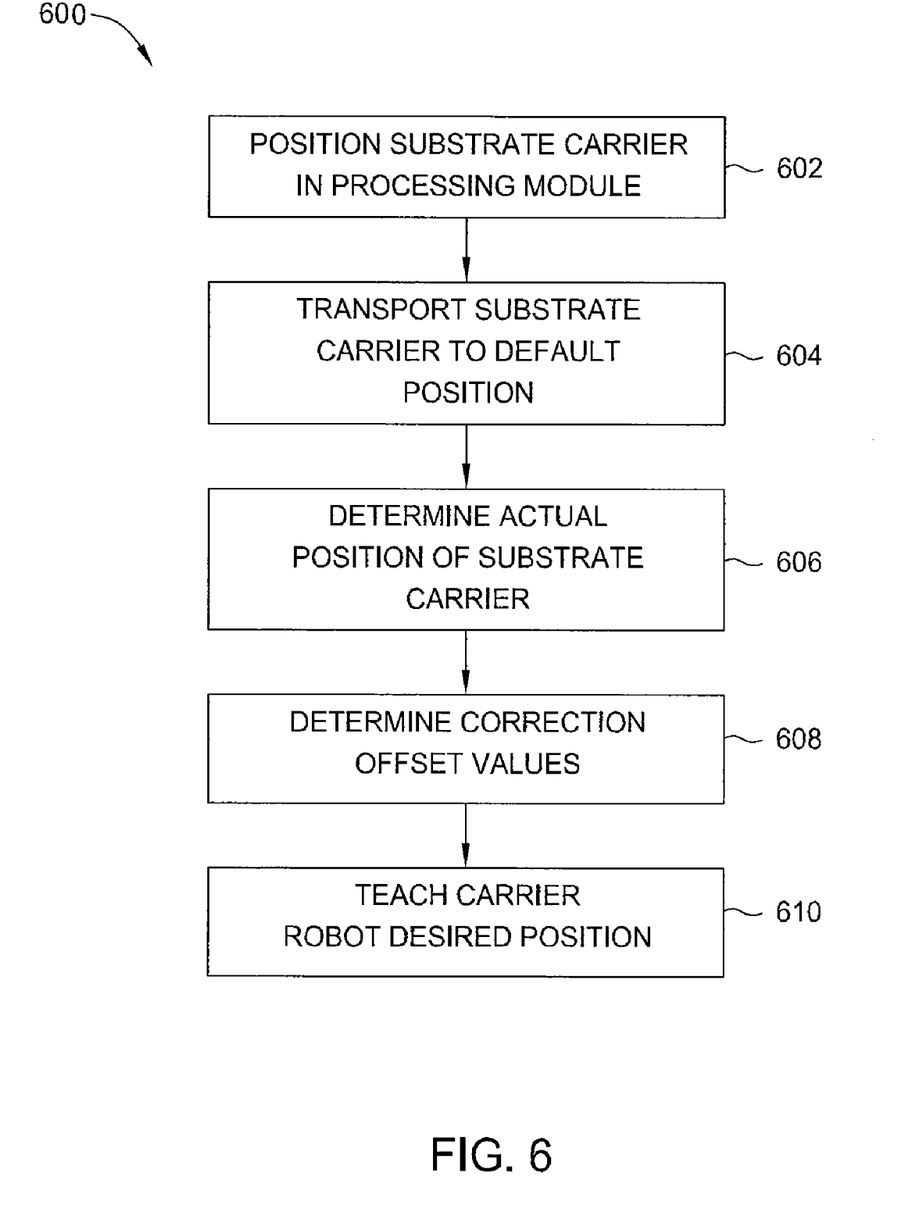
FIG. 6 is a process flow diagram illustrating a processing sequence used to calibrate the placement of a substrate carrier in a loading position according to one embodiment of the present invention.

As discussed above, the system controller 101 has the nominal coordinate positions of each of the substrate receiving positions 105A relative to the fiducial marks 142 on the substrate carrier 105 stored within its memory. Therefore, it is important that the substrate carrier 105 be accurately positioned for loading the substrates "S" into the substrate receiving positions 105A prior to performing the process sequence 400 (FIG. 4). FIG. 6 illustrates one embodiment of a processing sequence 600 which may be performed during step 402 (FIG. 4), and used to calibrate the carrier robot 180 to a substrate loading position on the automation components 106 in an automated fashion.

Referring primarily to FIGS. 1 and 6, in one embodiment, the processing sequence 600 begins at operation 602 with the substrate carrier 105 precisely positioned within the processing module 108. For instance, in the operation 602, the substrate carrier 105 may be precisely positioned within a load lock chamber (not shown) in the processing module 108 by an operator manually controlling a carrier robot 180. In operation 604, the system controller 101 instructs the carrier robot 180 to transport the substrate carrier 105 to a default substrate loading position. In one embodiment, the default substrate loading position is a preprogrammed position set prior to calibration of the carrier robot 180 or the robot assembly 130.

In operation 606, the one or more detectors 141 of the machine vision system views and transfers images of the fiducial marks 142 located on the substrate carrier 105. Using the information gathered by the machine vision system 140, the system controller 101 determines the actual position and angular orientation of the substrate carrier 105 located in the substrate loading position. In operation 608, the system controller 101 compares the actual position and angular orientation of the substrate carrier 105 to a desired position and angular orientation of the substrate carrier 105 to determine correction offset values.

In operation 610, the system controller 101 uses the correction offset values to teach the carrier robot 180 the desired position and angular orientation of the substrate carrier 105. In this operation, the carrier robot 180 may be instructed to retrieve the substrate carrier 105 from the actual position and replace the substrate carrier 105 into the desired position using the correction offset values determined in operation 608. The desired position as taught to the carrier robot 180 is then stored in the system controller 101 and used to control the carrier robot 180 for movement of the substrate carrier 105 during the process sequence 400.

Therefore, by following the alignment sequences described above the substrate carrier 105 and carrier robot 180 can be accurately aligned so that the loading of the substrates "S" into the substrate receiving positions 105A can be easily determined and controlled to provide a process of automatically loading substrates into a substrate carrier and preventing the possible damage to the often fragile solar cell substrates commonly found in conventional substrate handling processes.

While the foregoing is directed to embodiments of the present invention, other and further embodiments of the invention may be devised without departing from the basic scope thereof, and the scope thereof is determined by the claims that follow.

The invention claimed is:

1. A solar cell formation process, comprising:
positioning a substrate carrier having an array of substrate receiving positions on a carrier receiving surface;
positioning a substrate on a substrate receiving surface of an end effector of a robot;
determining an actual position of the substrate on the substrate receiving surface of the end effector, wherein determining the actual position comprises:
emitting electromagnetic radiation towards a surface of the substrate and the substrate receiving surface of the end effector; and
receiving a portion of the emitted electromagnetic radiation at a defined wavelength reflected from the surface of the substrate and the substrate receiving surface of the end effector by a detector, wherein the detector uses the received portion of the emitted electromagnetic radiation to form a first image; and
positioning the substrate in one of the array of substrate receiving positions, wherein positioning the substrate comprises adjusting the placement of the substrate using the information received from the first image.

2. The process of claim 1, wherein positioning the substrate carrier comprises:
placing the substrate carrier on the carrier receiving surface;
detecting reference features located on the substrate carrier with a vision system; and
determining an actual position and orientation of the substrate carrier using information received from the vision system.

3. The process of claim 2, wherein the reference features include identification information unique to the substrate carrier.

4. The process of claim 1, wherein positioning the substrate carrier comprises:
transporting the substrate carrier from a known position to a default position and orientation on the carrier receiving surface;
viewing the substrate carrier with a vision system;
determining an actual position and orientation of the substrate carrier using information received from the vision system;
determining an offset between the actual position and orientation and the default position and orientation; and
repositioning the substrate carrier on the carrier receiving surface using the offset.

5. The process of claim 1, further comprising determining if the substrate has a defect therein using information found in the first image.

6. The process of claim 1, further comprising:
repositioning the substrate on the substrate receiving surface of the end effector;
determining the actual position of the repositioned substrate on the substrate receiving surface of the end effector, wherein determining the actual position of the repositioned substrate comprises:
emitting electromagnetic radiation towards the surface of the substrate and the substrate receiving surface of the end effector; and
receiving a portion of the emitted electromagnetic radiation at the defined wavelength reflected from the surface of the substrate and the substrate receiving surface of the end effector by the detector, wherein the detector uses the received portion of the emitted electromagnetic radiation to form a second image; and
repositioning the substrate in the one of the array of substrate receiving positions, wherein the repositioning the substrate in the one of the array of substrate receiving positions comprises adjusting the placement of the substrate using information received from the first and second images.

7. The process of claim 1, further comprising:
transferring a substrate into each of the array of substrate receiving positions on the substrate carrier; and
transferring the substrate carrier into a processing module.

8. A solar cell formation process, comprising:
positioning an end effector of a robot in a nominal position over a first substrate disposed in one of an array of substrate receiving positions on a substrate carrier;
receiving the first substrate on the end effector while the end effector is in the nominal position;
determining an actual position of the first substrate positioned on the end effector using a detection system;
calculating an offset of the actual position from an expected position of the first substrate on the end effector;
calculating a new nominal position using the offset and storing the new nominal position in memory of a system controller;
receiving a second substrate on the end effector;
positioning the end effector in the new nominal position; and
depositing the second substrate in the one of the array of substrate receiving positions.

9. The process of claim 8, wherein the determining the actual position comprises:
emitting electromagnetic radiation towards a surface of the first substrate and a surface of the end effector; and
receiving a portion of the emitted electromagnetic radiation at a defined wavelength reflected from the surface of the first substrate and the surface of the end effector by a detector, wherein the detector uses the received portion of the emitted electromagnetic radiation to form a first image.

10. The process of claim 9, wherein information from the first image is used to calculate the offset.

11. The process of claim 10, further comprising determining an actual position of the second substrate on the end effector, comprising:
emitting electromagnetic radiation towards a surface of the second substrate and the surface of the end effector; and
receiving a portion of the emitted electromagnetic radiation at a defined wavelength reflected from the surface of the second substrate and the surface of the end effector by the detector, wherein the detector uses the received portion of the emitted electromagnetic radiation to form a second image.

12. The process of claim 11, wherein information from the second image is used in positioning the end effector in the new nominal position.

13. The process of claim 12, wherein the defined wavelength is selected so that it is absorbed by a material disposed on the surface of the first and second substrates.

14. The process of claim 13, further comprising determining if the second substrate has a defect therein using information from the second image.

15. The process of claim 12, further comprising:
positioning the substrate carrier in a default position on a carrier receiving surface;
viewing features of the substrate carrier with a vision system;
determining an actual position and orientation of the substrate carrier using information received from the vision system;
determining an offset between the actual position and orientation and the default position and orientation; and
repositioning the substrate carrier on the carrier receiving surface using the offset.

16. The process of claim 12, further comprising:
positioning the substrate carrier on a carrier receiving surface;
viewing features of the substrate carrier with a vision system; and
determining an actual position and orientation of the substrate carrier using information received from the vision system.

17. A solar cell processing system, comprising:
a robot having an end effector configured to receive a substrate;
a detection system comprising:
an electromagnetic radiation source configured to emit electromagnetic radiation at one or more desired wavelengths;

a detection assembly that is positioned to receive at least a portion of the emitted electromagnetic radiation reflected from a surface of a substrate disposed on the end effector of the robot; and one or more walls that are adapted to at least partially enclose the electromagnetic radiation source and the detection assembly; and a system controller configured to receive a signal from the detection assembly regarding the position of the substrate that is disposed on the end effector of the robot and determine an actual position of the substrate with respect to the end effector.

18. The system of claim 17, wherein the system controller is further configured to determine an offset between the actual position of the substrate and a desired position of the substrate.

19. The system of claim 18, wherein the system controller is further configured to transfer the substrate to a substrate receiving position in a substrate carrier using the offset.

20. The system of claim 19, wherein the system controller is further configured to determine if a defect exists on the surface of the substrate based on information received from the detection assembly.

* * * * *